United States Patent
Zhou et al.

(10) Patent No.: US 8,936,732 B2
(45) Date of Patent: Jan. 20, 2015

(54) WHITE LIGHT EMITTING GLASS-CERAMIC AND PRODUCTION METHOD THEREOF

(75) Inventors: Mingjie Zhou, Guangdong (CN); Wenbo Ma, Guangdong (CN); Fangyi Weng, Guangdong (CN)

(73) Assignee: Ocean's King Lighting Science & Technology Co., Ltd., Guangdong (CN)

( * ) Notice: Subject to any disclaimer, the term of this patent is extended or adjusted under 35 U.S.C. 154(b) by 119 days.

(21) Appl. No.: 13/809,679

(22) PCT Filed: Jul. 22, 2010

(86) PCT No.: PCT/CN2010/075380
§ 371 (c)(1),
(2), (4) Date: Jan. 11, 2013

(87) PCT Pub. No.: WO2012/009853
PCT Pub. Date: Jan. 26, 2012

(65) Prior Publication Data
US 2013/0112919 A1   May 9, 2013

(51) Int. Cl.
*C03C 10/16* (2006.01)
*C03C 10/14* (2006.01)
(Continued)

(52) U.S. Cl.
CPC ......... *C09K 11/7774* (2013.01); *C03C 10/0009* (2013.01); *C09K 11/7766* (2013.01); *C03B 32/00* (2013.01); *C03B 32/02* (2013.01);
(Continued)

(58) Field of Classification Search
CPC .......... C09K 11/7774; C09K 11/7766; C03C 10/0009; C03C 10/16; C03B 32/02
USPC ....... 252/301.4 F, 301.4 H; 501/2, 3, 5, 6, 32; 313/503; 257/98; 65/33.1, 33.3, 33.7
See application file for complete search history.

(56) References Cited

U.S. PATENT DOCUMENTS 6,132,643 A  * 10/2000  Pavel ..................... 252/301.4 R
2013/0069005 A1* 3/2013  Zhou et al. .............. 252/301.4 F

FOREIGN PATENT DOCUMENTS

| CN | 101092282 | * 12/2007 |
| CN | 101456675 | 6/2009 |
| CN | 101723593 | 6/2010 |

OTHER PUBLICATIONS

Eichelbaum et al., "Plasmonic Enhancement or Energy Transfer? On the Luminescence of Gold-, Silver, and Lanthanide-Doped Silicate Glasses and Its Potential for Light-Emitting Device," Adv. Funct. Mater, 2009, 2045-2052.

(Continued)

*Primary Examiner* — Carol M Koslow
(74) *Attorney, Agent, or Firm* — McDonnell Boehnen Hulbert & Berghoff LLP

(57) ABSTRACT

A white light emitting glass-ceramic. The chemical formula of the glass-ceramic is $aSiO_2 \cdot bAl_2O_3 \cdot cNaF \cdot dCeF_3 \cdot nDyF_3 \cdot mAg$, wherein a, b, c, d, n and m are, by mol part, 25-50, 15-30, 10-30, 10-25, 0.01-1 and 0.01-1, respectively, and a+b+c+d-100. A method for producing said glass-ceramic is also provided. Silver ion is doped in the glass-ceramic in the form of silver particles by means of sintering and reduction annealing treatment, and thus the luminescence properties of rare earth ion is improved.

14 Claims, 1 Drawing Sheet

(51) Int. Cl.
  C03C 4/12    (2006.01)
  C03B 32/02   (2006.01)
  C09K 11/77   (2006.01)
  C03C 10/00   (2006.01)
  C03B 32/00   (2006.01)
  C03C 3/112   (2006.01)
  H01L 33/50   (2010.01)

(52) U.S. Cl.
  CPC . *C03C3/112* (2013.01); *C03C 4/12* (2013.01); *C03C 10/16* (2013.01); *H01L 33/502* (2013.01); *Y02B 20/181* (2013.01)
  USPC .......... 252/301.4 F; 252/301.4 H; 501/2; 501/3; 501/5; 501/6; 501/32; 313/503; 257/98; 65/33.1; 65/33.3; 65/33.7

(56) References Cited

OTHER PUBLICATIONS

Hayakawa et al. "Enhanced Fluorescence from Eu3+Owing to Surface Plasma Oscillation of Silver Particles in Glass", Journal of Non-Crystalline Solids, Nov. 1999, vol. 259, No. 1-3, pp. 16-22.

Wang, et al. "Fluorescence Enhancement of Dysprosium Complex by Binding to Silver Nanoparticles", Chinese Journal of Inorganic Chemistry, Mar. 2008, vol. 24, No. 3, pp. 409-414.

\* cited by examiner

WHITE LIGHT EMITTING GLASS-CERAMIC AND PRODUCTION METHOD THEREOF

TECHNICAL FIELD

The present invention belongs to the technical field of luminescent materials, and in particular relates to a white light emitting glass ceramic and a production method thereof.

BACKGROUND

Along with the development of the semi-conductive illuminating technology (LED), this evolutional new light source gradually enters our daily life. Using the third generation of the semi-conductive material, gallium nitride, as a semi-conductive illuminating light source, the power consumption under equivalent brightness is only one tenth comparing with normal incandescent lamp, and the service life can reach above 100,000 hours. As a new illuminating technology, LED has many advantages such as energy-saving, environment-friendliness and flexibility in application, and may be widely applied in various fields such as indication, display, decoration, backlight devices, and general illumination. Most of the currently commercialized white light LED illuminating devices employ blue-light LED chips in coordination with fluorescent powders which emit yellow, green or orange lights under excitation of blue lights. This type of fluorescent powders has relatively high luminescent efficiency, and the preparation method thereof is well-established. However, the light source devices produced by this method have the following disadvantages: (1) the epoxy resins used for encapsulation are liable to deteriorate and would become yellow under the illumination of blue, violet or ultra-violet lights, leading to decrease in the service life of the devices; (2) the process is complex and the cost is relatively high; and (3) the light decay rates of the fluorescent powders and the chips are different, resulting in that the color coordinates are instable and that the white light is liable to drift.

In comparison with powder materials, glass ceramics, which achieve luminescence under excitation of violet or ultraviolet lights, have significant advantages: (1) good light transmission; (2) exceptional chemical and thermal stability; (3) simple preparation process and low cost; (4) liability to be made into bulk and various shapes; and (5) possibility to substitute epoxy resins. Due to these characteristics, glass ceramics capable of achieving high performance luminescence are very suitable as the luminescent media materials in the LED lamination field. Accordingly, it is in great need to find suitable substrates and rare earth ions for glass ceramics which are suitable for emitting white light under the excitation of blue or ultra-violet lights. However, as the lattice structure of glass is compact, the solid solubility of rare earth ions in the lattice of glass is relatively low. In addition, commonly used silicate glasses have relatively high phonon energy, resulting in high probability of non-radiative recombination of the doped rare earth ions. This significantly reduces the probability of radiative recombination of the rare earth ions, resulting in low luminescent intensity, or even no luminescence, of rare earth ions in glass.

SUMMARY

In view of the above, the present invention provides a white light emitting glass ceramic having a high luminescent efficiency.

It is further provided a method for producing a white light emitting glass ceramic.

It is provided a glass ceramic emitting white light, having a chemical formula of: $aSiO_2 \cdot bAl_2O_3 \cdot cNaF \cdot dCeF_3 \cdot nDyF_3 \cdot mAg$, wherein a, b, c, d, n and m represent molar parts, and the values of a, b, c, d, n and m are: a is 25~50, b is 15~30, c is 10~30, d is 10~25, n is 0.01~1, m is 0.01~1, and a+b+c+d=100.

It is further provided a method for producing a white light emitting glass ceramic, comprising:

providing raw materials $SiO_2$, $Al_2O_3$, NaF, $CeF_3$, $DyF_3$ and $AgNO_3$ in a stoichiometric ratio according to molar ratio of corresponding elements in a chemical formula of $aSiO_2 \cdot bAl_2O_3 \cdot cNaF \cdot dCeF_3 \cdot nDyF_3 \cdot mAg$, wherein a, b, c, d, n and m represent molar parts, and the values of a, b, c, d, n and m are: a is 25~50, b is 15~30, c is 10~30, d is 10~25, n is 0.01~1, m is 0.01~1, and a+b+c+d=100; melting the mixed powder to produce a glass precursor; and reductively annealing the glass precursor in a reductive atmosphere, and cooling to produce the white light emitting glass ceramic having the chemical formula of $aSiO_2 \cdot bAl_2O_3 \cdot cNaF \cdot dCeF_3 \cdot nDyF_3 \cdot mAg$.

In the above white light emitting glass ceramic and the production method thereof, by introducing elemental Ag particles, the resulted surface plasma resonance effect significantly increases the luminescent intensity of the rare earth ions doped in the glass ceramic substrate, thereby increasing the luminescent intensity of the glass ceramic. This white light emitting glass ceramic is suitable as a luminescent media material for a white light LED under excitation of ultra-violet light, and has a great application potential in the lamination and display fields.

SPECIFIC EMBODIMENTS

In order to make the objectives, the technical solutions and the advantages of the present invention more obvious, the present invention will be further described in detail in combination with the drawings and embodiments. It shall be understood that the specific embodiments described herein are only to illustrate rather than to limit the present invention.

The white light emitting glass ceramic of an embodiment of the present invention has a chemical formula of: $aSiO_2 \cdot bAl_2O_3 \cdot cNaF \cdot dCeF_3 \cdot nDyF_3 \cdot mAg$, wherein a, b, c, d, n and m represent molar parts, and the values of a, b, c, d, n and m are: a is 25~50, b is 15~30, c is 10~30, d is 10~25, n is 0.01~1, m is 0.01~1, and a+b+c+d=100. Furthermore, a is preferably 35~50, b is preferably 20~30, c is preferably 10~20, d is preferably 10~20, n is preferably 0.1~1, and m is preferably 0.01~0.5.

It can be seen from the above chemical formula that the white light emitting glass ceramic employs $Al_2O_3$—$SiO_2$—NaF—$CeF_3$ as the substrate, which is doped with $Dy^{3+}$. $Dy^{3+}$ belongs to strongly fluorescent rare earth ions. It has $4f^9$ electronic configuration, and the two strongest fluorescence emission peaks thereof are blue hypersensitive transition ($^4F_{9/2}$-$^6H_{15/2}$) at 470-500 nm and yellow hypersensitive transition ($^4F_{9/2}$-$^6H_{13/2}$) at 570-600 nm. Yellow emission would be strongly affected by the crystalline field. By changing the crystalline field environment in which $Dy^{3+}$ is present, the yellow-blue ratio can be adjusted. When the yellow-blue ratio is suitable, $Dy^{3+}$ would emit white light. During the deposition of fluoride crystals from oxyfluoride glass, rare earth light-emitting ions may act as a nucleating agent, and may enter the fluoride crystals by replacing the lattice positions of cations. In addition, fluorides have relatively low phonon energy and have reduced probability of non-radiative transition and low energy consumption, as comparing with silicate glass. On the other hand, since the glass substrate components are adjustable within certain ranges, the improvement of the luminescent intensities of glass ceramics may be achieved by adjusting the glass substrate components.

Figure 1:
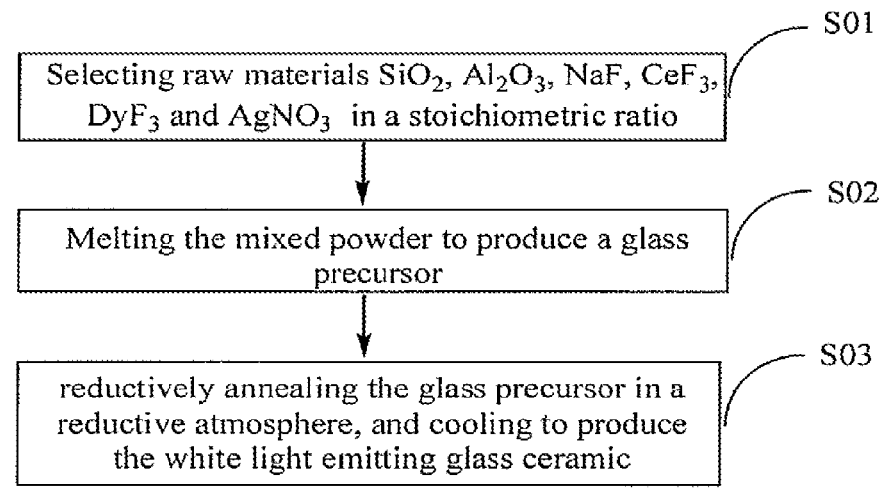
FIG. 1 is a flow chart of the method for producing a white light emitting glass ceramic according to an embodiment of the present invention.

Referring to FIG. 1, which illustrates a flow chart of the method for producing a white light emitting glass ceramic according to an embodiment of the present invention, the method comprises:

S01: selecting raw materials $SiO_2$, $Al_2O_3$, NaF, $CeF_3$, $DyF_3$ and $AgNO_3$ in a stoichiometric ratio according to molar ratio of corresponding elements in a chemical formula of $aSiO_2 \cdot bAl_2O_3 \cdot cNaF \cdot dCeF_3 \cdot nDyF_3 \cdot mAg$, wherein a, b, c, d, n and m represent molar parts, and the values of a, b, c, d, n and m are: a is 25~50, b is 15~30, c is 10~30, d is 10~25, n is 0.01~1, m is 0.01~1, and a+b+c+d=100; S02: melting the mixed powder to produce a glass precursor; and S03: reductively annealing the glass precursor in a reductive atmosphere, and cooling to produce the white light emitting glass ceramic having the chemical formula of $aSiO_2 \cdot bAl_2O_3 \cdot cNaF \cdot dCeF_3 \cdot nDyF_3 \cdot mAg$.

After the raw materials are obtained following step S01, they are milled in a mortar to be mixed homogeneously, and placed in a corundum crucible or a platinum crucible. Preferably, a is 35~50, b is 20~30, c is 10~20, d is 10~20, n is 0.1~1, and m is 0.01~0.5.

Step S02 specifically comprises placing the crucible with cover into a high temperature furnace to melt the materials, pouring the glass melt in a cast iron mould, and pressing it into a transparent glass. In a preferred embodiment of the present invention, the melting temperature is 1200~1500° C., and the melting time is 0.5~3 h.

In step S03, the reductive annealing treatment comprises two stages: reductive annealing treatment and pure annealing treatment. The reductive annealing treatment comprises placing the moulded glass into an annealing furnace, heating to 300~550° C. in a nitrogen-hydrogen mixed reductive atmosphere ($N_2$ and $H_2$ volume ratio is 95:5) and maintaining the temperature for 0.5~5 h to reduce Ag ions to elemental Ag. In addition, maintaining high temperature can eliminate the internal stress of the glass. After that, turn off the reductive gases and conduct an annealing treatment, in which the temperature is increased to 550~800° C. and maintained for 1~5 h. The annealing treatment changes the morphology and size of elemental Ag to make it interact with rare earth ions, and significantly increase the luminescent intensity of rare earth ions doped in the glass ceramic substrate. Meanwhile, the rare earth fluoride in the parent glass may be sufficiently nucleated, facilitating the improvement of the luminescent intensity of glass ceramic. After annealing treatment, the glass ceramic is cooled down to room temperature along with the annealing furnace to obtain the white light emitting glass ceramic with the predetermined molar composition.

In the following, various compositions of the white light emitting glass ceramic and production method thereof and performance thereof are illustrated with various examples.

Example 1

The raw materials, 2.900 g $SiO_2$, 5.920 g $Al_2O_3$, 1.620 g NaF, 9.540 g $CeF_3$, 0.004 g $DyF_3$, and 0.329 g $AgNO_3$, are weighed into a mortar, milled to mix homogeneously, and placed in a corundum crucible. The corundum crucible loaded with the raw materials is placed into a 1300° C. high temperature furnace with cover to melt the raw materials. After maintaining the temperature for 1 h, the glass melt is poured into a cast iron mould and pressed into a transparent glass. The transparent glass is then placed in an annealing furnace, and heated to 400° C. in a nitrogen-hydrogen reductive atmosphere ($V(N_2):V(H_2)=95:5$). After maintaining the temperature for 0.5 h, the nitrogen-hydrogen reductive gases are turned off, and the mixture is heated to 600° C. After maintaining the temperature for 5 h, the annealing furnace is turned off and naturally cooled down to room temperature to give the light emitting glass ceramic having the chemical formula of $25SiO_2 \cdot 30Al_2O_3 \cdot 20NaF \cdot 25CeF_3 \cdot 0.01DyF_3 \cdot 1Ag$.

Example 2

The raw materials, 4.760 g $SiO_2$, 3.460 g $Al_2O_3$, 2.850 g NaF, 8.920 g $CeF_3$, 0.497 g $DyF_3$ and 0.003 g $AgNO_3$, are weighed into a mortar, milled to mix homogeneously, and placed in a corundum crucible. The corundum crucible loaded with the raw materials is placed into a 1200° C. high temperature furnace with cover to melt the raw materials. After maintaining the temperature for 0.5 h, the glass melt is poured into a cast iron mould and pressed into a transparent glass. The transparent glass is then placed in an annealing furnace, and heated to 300° C. in a nitrogen-hydrogen reductive atmosphere ($V(N_2):V(H_2)=95:5$), After maintaining the temperature for 1 h, the nitrogen-hydrogen reductive gases are turned off, and the mixture is heated to 550° C. After maintaining the temperature for 4 h, the annealing furnace is turned off and naturally cooled down to room temperature to give the light emitting glass ceramic having the chemical formula of $35SiO_2 \cdot 15Al_2O_3 \cdot 30NaF \cdot 20CeF_3 \cdot 1DyF_3 \cdot 0.01Ag$.

Example 3

The raw materials, 6.380 g $SiO_2$, 4.330 g $Al_2O_3$, 0.890 g NaF, 8.380 g $CeF_3$, 0.047 g $DyF_3$, and 0.181 g $AgNO_3$, are weighed into a mortar, milled to mix homogeneously, and placed in a corundum crucible. The corundum crucible loaded with the raw materials is placed into a 1400° C. high temperature furnace with cover to melt the raw materials. After maintaining the temperature for 2 h, the glass melt is poured into a cast iron mould and pressed into a transparent glass. The transparent glass is then placed in an annealing furnace, and heated to 500° C. in a nitrogen-hydrogen reductive atmosphere ($V(N_2):V(H_2)=95:5$). After maintaining the temperature for 2 h, the nitrogen-hydrogen reductive gases are turned off, and the mixture is heated to 700° C. After maintaining the temperature for 3 h, the annealing furnace is turned off and naturally cooled down to room temperature to give the light emitting glass ceramic having the chemical formula of $50SiO_2 \cdot 20Al_2O_3 \cdot 10NaF \cdot 20CeF_3 \cdot 0.1DyF_3 \cdot 0.5Ag$.

Example 4

The raw materials, 7.100 g $SiO_2$, 7.230 g $Al_2O_3$, 0.990 g NaF, 4.660 g $CeF_3$, 0.260 g $DyF_3$, and 0.321 g $AgNO_3$, are weighed into a mortar, milled to mix homogeneously, and placed in a corundum crucible, The corundum crucible loaded with the raw materials is placed into a 1500° C. high temperature furnace with cover to melt the raw materials, After maintaining the temperature for 3 h, the glass melt is poured into a cast iron mould and pressed into a transparent glass. The transparent glass is then placed in an annealing furnace, and heated to 500° C. in a nitrogen-hydrogen reductive atmosphere ($V(N_2)$: $V(H_2)$=95:5), After maintaining the temperature for 2 h, the nitrogen-hydrogen reductive gases are turned off, and the mixture is heated to 800° C. After maintaining the temperature for 1 h, the annealing furnace is turned off and naturally cooled down to room temperature to give the light emitting glass ceramic having the chemical formula of $50SiO_2 \cdot 30Al_2O_3 \cdot 10NaF \cdot 10CeF_3 \cdot 0.5DyF_3 \cdot 0.8Ag$.

Example 5

The raw materials, 5.450 g $SiO_2$, 5.780 g $Al_2O_3$, 1.900 g NaF, 6.710 g $CeF_3$, 0.090 g $DyF_3$, and 0.030 g $AgNO_3$, are weighed into a mortar, milled to mix homogeneously, and placed in a corundum crucible. The corundum crucible loaded with the raw materials is placed into a 1450° C. high temperature furnace with cover to melt the raw materials. After maintaining the temperature for 2 h, the glass melt is poured into a cast iron mould and pressed into a transparent glass. The transparent glass is then placed in an annealing furnace, and heated to 350° C. in a nitrogen-hydrogen reductive atmosphere ($V(N_2):V(H_2)$=95:5). After maintaining the temperature for 4 h, the nitrogen-hydrogen reductive gases are turned off, and the mixture is heated to 750° C. After maintaining the temperature for 2 h, the annealing furnace is turned off and naturally cooled down to room temperature to give the light emitting glass ceramic having the chemical formula of $40SiO_2 \cdot 25Al_2O_3 \cdot 20NaF \cdot 15CeF_3 \cdot 0.2DyF_3 \cdot 0.1Ag$.

Example 6

The raw materials, 3.730 g $SiO_2$, 6.340 g $Al_2O_3$, 1.740 g NaF, 8.170 g $CeF_3$, 0.364 g $DyF_3$, and 0.071 g $AgNO_3$, are weighed into a mortar, milled to mix homogeneously, and placed in a corundum crucible. The corundum crucible loaded with the raw materials is placed into a 1350° C. high temperature furnace with cover to melt the raw materials, After maintaining the temperature for 1 h, the glass melt is poured into a cast iron mould and pressed into a transparent glass. The transparent glass is then placed in an annealing furnace, and heated to 450° C. in a nitrogen-hydrogen reductive atmosphere ($V(N_2):V(H_2)$=95:5). After maintaining the temperature for 5 h, the nitrogen-hydrogen reductive gases are turned off, and the mixture is heated to 650° C., After maintaining the temperature for 3 h, the annealing furnace is turned off and naturally cooled down to room temperature to give the light emitting glass ceramic having the chemical formula of $30SiO_2 \cdot 30Al_2O_3 \cdot 20NaF \cdot 20CeF_3 \cdot 0.8DyF_3 \cdot 0.2Ag$.

Example 7

The raw materials, 6.100 g $SiO_2$, 5.750 g $Al_2O_3$, 1.420 g NaF, 6.670 g $CeF_3$, 0.020 g $DyF_3$, and 0.010 g $AgNO_3$, are weighed into a mortar, milled to mix homogeneously, and placed in a corundum crucible. The corundum crucible loaded with the raw materials is placed into a 1480° C. high temperature furnace with cover to melt the raw materials. After maintaining the temperature for 1 h, the glass melt is poured into a cast iron mould and pressed into a transparent glass. The transparent glass is then placed in an annealing furnace, and heated to 450° C. in a nitrogen-hydrogen reductive atmosphere ($V(N_2):V(H_2)$=95:5). After maintaining the temperature for 2.5 h, the nitrogen-hydrogen reductive gases are turned off, and the mixture is heated to 500° C. After maintaining the temperature for 2.5 h, the annealing furnace is turned off and naturally cooled down to room temperature to give the light emitting glass ceramic having the chemical formula of $45SiO_2 \cdot 25Al_2O_3 \cdot 15NaF \cdot 15CeF_3 \cdot 0.05DyF_3 \cdot 0.05Ag$.

Example 8

The raw materials, 5.080 g $SiO_2$, 7.390 g $Al_2O_3$, 2.530 g NaF, 4.760 g $CeF_3$, 0.040 g $DyF_3$, and 0.160 g $AgNO_3$, are weighed into a mortar, milled to mix homogeneously, and placed in a corundum crucible. The corundum crucible loaded with the raw materials is placed into a 1250° C. high temperature furnace with cover to melt the raw materials. After maintaining the temperature for 2 h, the glass melt is poured into a cast iron mould and pressed into a transparent glass. The transparent glass is then placed in an annealing furnace, and heated to 300° C. in a nitrogen-hydrogen reductive atmosphere ($V(N_2):V(H_2)$=95:5). After maintaining the temperature for 1.5 h, the nitrogen-hydrogen reductive gases are turned off, and the mixture is heated to 700° C. After maintaining the temperature for 3.5 h, the annealing furnace is turned off and naturally cooled down to room temperature to give the light emitting glass ceramic having the chemical formula of $35SiO_2 \cdot 30Al_2O_3 \cdot 25NaF \cdot 10CeF_3 \cdot 0.08DyF_3 \cdot 0.4Ag$.

Comparative Example 1

The raw materials, 5.450 g $SiO_2$, 5.780 g $Al_2O_3$, 1.900 g NaF, 6.710 g $CeF_3$, and 0.090 g $DyF_3$, are weighed into a mortar, milled to mix homogeneously, and placed in a corundum crucible. The corundum crucible loaded with the raw materials is placed into a 1450° C. high temperature furnace with cover to melt the raw materials. After maintaining the temperature for 2 h, the glass melt is poured into a cast iron mould and pressed into a transparent glass. The transparent glass is then placed in an annealing furnace, and heated to 350° C. in a nitrogen-hydrogen reductive atmosphere ($V(N_2):V(H_2)$=95:5). After maintaining the temperature for 4 h, the nitrogen-hydrogen reductive gases are turned off, and the mixture is heated to 750° C. After maintaining the temperature for 2 h, the annealing furnace is turned off and naturally cooled down to room temperature to give the light emitting glass ceramic having the chemical formula of $40SiO_2 \cdot 25Al_2O_3 \cdot 20NaF \cdot 15CeF_3 \cdot 0.2DyF_3$.

Figure 2:
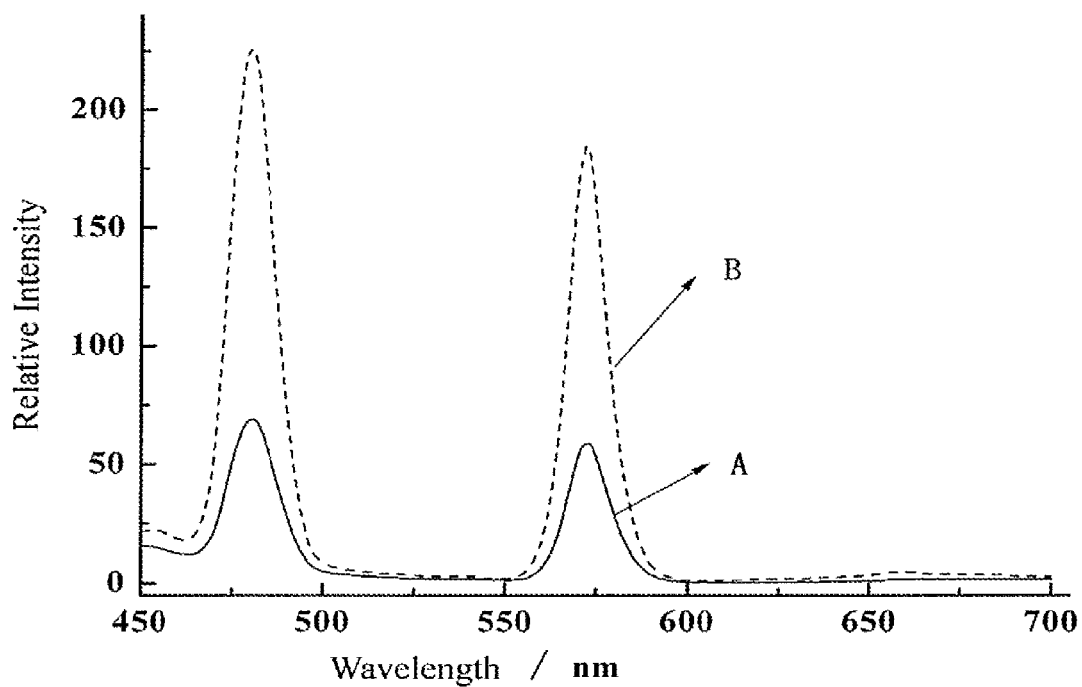
FIG. 2 is the emission spectrum of the glass ceramics produced in Example 5 and Comparative Example 1 under excitation at 250 nm; wherein A refers to the sample of Comparative Example 1, the raw materials of which do not include $AgNO_3$, and B refers to the sample of Example 5, the raw materials of which include 0.1 mol % $AgNO_3$.

The sample of Example 5 is discussed as an example, referring to FIG. 2, which shows the emission spectrum of the white light emitting glass ceramics produced in Example 5 and Comparative Example 1 under excitation at 250 nm. As shown in the figure, the sample of Example 5, the raw materials of which include 0.1 mol % $AgNO_3$, and the sample of Comparative Example 1, the raw materials of which do not include $AgNO_3$, both have main fluorescent emission peaks at 480 nm and 572 nm, but he sample doped with Ag has a emission intensity which is 190% higher than that of the sample un-doped with Ag. The Ag ions introduced into the precursor glass during the melting process is subsequently reduced to elemental Ag particles by the reductive thermal treatment; and the morphology and size of the elemental Ag particles are changed by a suitable thermal treatment to make them interact with rare earth ions, thereby obtaining a white light emitting glass ceramic having a high luminescent intensity.

From the results of the Examples and the Comparative Example, in the white light emitting glass ceramic and the production method thereof, metal particles are introduced into the glass ceramic by melting, reductive thermal treatment and annealing treatment; and their plasma resonance effect may increase the light emission of the rare earth ions. The production process is simple with low cost, and has a broad application prospect.

Described above are only preferred embodiments of the present invention, which are not intended to limit the present invention. All modifications, equivalent substitutions and improvement within the spirit and principle of the present invention shall be within the scope of the present invention.

The invention claimed is:

1. A glass ceramic emitting white light, having a chemical formula of:

$a\text{SiO}_2 \cdot b\text{Al}_2\text{O}_3 \cdot c\text{NaF} \cdot d\text{CeF}_3 \cdot n\text{DyF}_3 \cdot m\text{Ag}$, wherein a, b, c, d, n and m represent molar parts, and the values of a, b, c, d, n and m are: a is 25~50, b is 15~30, c is 10~30, d is 10~25, n is 0.01~1, m is 0.01~1, and a+b+c+d=100.

2. The glass ceramic emitting white light according to claim 1, wherein the values of a, b, c, d, n and m are: a is 35~50, b is 20~30, c is 10~20, d is 10~20, n is 0.1~1.

3. The glass ceramic emitting white light according to claim 1, wherein m is 0.01~0.5.

4. The glass ceramic emitting white light according to claim 1, the chemical formula of which is selected from
$25\text{SiO}_2 \cdot 30\text{Al}_2\text{O}_3 \cdot 20\text{NaF} \cdot 25\text{CeF}_3 \cdot 0.01\text{DyF}_3 \cdot 1\text{Ag}$,
$35\text{SiO}_2 \cdot 15\text{Al}_2\text{O}_3 \cdot 30\text{NaF} \cdot 20\text{CeF}_3 \cdot 1\text{DyF}_3 \cdot 0.01\text{Ag}$,
$50\text{SiO}_2 \cdot 20\text{Al}_2\text{O}_3 \cdot 10\text{NaF} \cdot 20\text{CeF}_3 \cdot 0.1\text{DyF}_3 \cdot 0.5\text{Ag}$,
$50\text{SiO}_2 \cdot 30\text{Al}_2\text{O}_3 \cdot 10\text{NaF} \cdot 10\text{CeF}_3 \cdot 0.5\text{DyF}_3 \cdot 0.8\text{Ag}$,
$40\text{SiO}_2 \cdot 25\text{Al}_2\text{O}_3 \cdot 20\text{NaF} \cdot 15\text{CeF}_3 \cdot 0.2\text{DyF}_3 \cdot 0.1\text{Ag}$,
$30\text{SiO}_2 \cdot 30\text{Al}_2\text{O}_3 \cdot 20\text{NaF} \cdot 20\text{CeF}_3 \cdot 0.8\text{DyF}_3 \cdot 0.2\text{Ag}$,
$45\text{SiO}_2 \cdot 25\text{Al}_2\text{O}_3 \cdot 15\text{NaF} \cdot 15\text{CeF}_3 \cdot 0.05\text{DyF}_3 \cdot 0.05\text{Ag}$, and
$35\text{SiO}_2 \cdot 30\text{Al}_2\text{O}_3 \cdot 25\text{NaF} \cdot 10\text{CeF}_3 \cdot 0.08\text{DyF}_3 \cdot 0.4\text{Ag}$.

5. A method for producing a white light emitting glass ceramic, comprising: providing raw materials $\text{SiO}_2$, $\text{Al}_2\text{O}_3$, NaF, $\text{CeF}_3$, $\text{DyF}_3$ and $\text{AgNO}_3$ in a stoichiometric ratio according to a chemical formula of $a\text{SiO}_2 \cdot b\text{Al}_2\text{O}_3 \cdot c\text{NaF} \cdot d\text{CeF}_3 \cdot n\text{DyF}_3 \cdot m\text{Ag}$, milling and mixing the raw materials to produce a mixed powder, wherein a, b, c, d, n and m represent molar parts, and the values of a, b, c, d, n and m are: a is 25~50, b is 15~30, c is 10~30, d is 10~25, n is 0.01~1, m is 0.01~1, and a+b+c+d=100;

melting the mixed powder to produce a glass precursor; and reductively annealing the glass precursor in a reductive atmosphere, and cooling to produce the white light emitting glass ceramic having the chemical formula of $a\text{SiO}_2 \cdot b\text{Al}_2\text{O}_3 \cdot c\text{NaF} \cdot d\text{CeF}_3 \cdot n\text{DyF}_3 \cdot m\text{Ag}$.

6. The method for producing a white light emitting glass ceramic according to claim 5, wherein the values of a, b, c, d, n and m are: a is 35~50, b is 20~30, c is 10~20, d is 10~20, n is 0.1~1.

7. The method for producing a white light emitting glass ceramic according to claim 5, wherein m is 0.01~0.5.

8. The method for producing a white light emitting glass ceramic according to claim 5, wherein the melting is carried out at a temperature of 1200~1500° C. for 0.5~3 h.

9. The method for producing a white light emitting glass ceramic according to claim 5, wherein the reductive annealing treatment comprises:

carrying out a reductive annealing treatment at 300~550° C. in a reductive atmosphere for 0.5~5 h; and turning off the reductive atmosphere, heating to 550~800° C., and carrying out an annealing treatment for 1~5 h, wherein the reductive atmosphere is a mixed reductive atmosphere consisting of nitrogen and hydrogen having an $N_2$ and $H_2$ volume ratio is 95:5.

10. The method for producing a white light emitting glass ceramic according to claim 5, wherein the chemical formula of the white light emitting glass ceramic is selected from
$25\text{SiO}_2 \cdot 30\text{Al}_2\text{O}_3 \cdot 20\text{NaF} \cdot 25\text{CeF}_3 \cdot 0.01\text{DyF}_3 \cdot 1\text{Ag}$,
$35\text{SiO}_2 \cdot 15\text{Al}_2\text{O}_3 \cdot 30\text{NaF} \cdot 20\text{CeF}_3 \cdot 1\text{DyF}_3 \cdot 0.01\text{Ag}$,
$50\text{SiO}_2 \cdot 20\text{Al}_2\text{O}_3 \cdot 10\text{NaF} \cdot 20\text{CeF}_3 \cdot 0.1\text{DyF}_3 \cdot 0.5\text{Ag}$,
$50\text{SiO}_2 \cdot 30\text{Al}_2\text{O}_3 \cdot 10\text{NaF} \cdot 10\text{CeF}_3 \cdot 0.5\text{DyF}_3 \cdot 0.8\text{Ag}$,
$40\text{SiO}_2 \cdot 25\text{Al}_2\text{O}_3 \cdot 20\text{NaF} \cdot 15\text{CeF}_3 \cdot 0.2\text{DyF}_3 \cdot 0.1\text{Ag}$,
$30\text{SiO}_2 \cdot 30\text{Al}_2\text{O}_3 \cdot 20\text{NaF} \cdot 20\text{CeF}_3 \cdot 0.8\text{DyF}_3 \cdot 0.2\text{Ag}$,
$45\text{SiO}_2 \cdot 25\text{Al}_2\text{O}_3 \cdot 15\text{NaF} \cdot 15\text{CeF}_3 \cdot 0.05\text{DyF}_3 \cdot 0.05\text{Ag}$, and
$35\text{SiO}_2 \cdot 30\text{Al}_2\text{O}_3 \cdot 25\text{NaF} \cdot 10\text{CeF}_3 \cdot 0.08\text{DyF}_3 \cdot 0.4\text{Ag}$.

11. A white light LED device under excitation of ultraviolet light, comprising the glass ceramic emitting white light according to claim 1.

12. A white light LED device under excitation of ultraviolet light, comprising the glass ceramic emitting white light according to claim 2.

13. A white light LED device under excitation of ultraviolet light, comprising the glass ceramic emitting white light according to claim 3.

14. A white light LED device under excitation of ultraviolet light, comprising the glass ceramic emitting white light according to claim 4.

* * * * *